United States Patent
Wuchert et al.

(10) Patent No.: US 9,240,847 B2
(45) Date of Patent: Jan. 19, 2016

(54) METHOD FOR SUPPRESSING INTERFERENCES IN A SAMPLING PROCESS AS WELL AS A DEVICE FOR CARRYING OUT THE METHOD

(71) Applicant: Robert Bosch GmbH, Stuttgart (DE)

(72) Inventors: Thomas Wuchert, Dermbach (DE); Matthias Kalisch, Filderstadt-Sielmingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/401,597

(22) PCT Filed: Mar. 25, 2013

(86) PCT No.: PCT/EP2013/056302
§ 371 (c)(1),
(2) Date: Nov. 17, 2014

(87) PCT Pub. No.: WO2013/170989
PCT Pub. Date: Nov. 21, 2013

(65) Prior Publication Data
US 2015/0146829 A1    May 28, 2015

(30) Foreign Application Priority Data
May 16, 2012 (DE) .......... 10 2012 208 281

(51) Int. Cl.
| | |
|---|---|
| H04L 7/00 | (2006.01) |
| H04B 15/00 | (2006.01) |
| H03M 1/06 | (2006.01) |
| G01D 3/032 | (2006.01) |
| H04L 7/02 | (2006.01) |
| H04L 27/10 | (2006.01) |
| H03M 1/12 | (2006.01) |

(52) U.S. Cl.
CPC .............. *H04B 15/00* (2013.01); *G01D 3/032* (2013.01); *H03M 1/0656* (2013.01); *H04L 7/02* (2013.01); *H04L 27/10* (2013.01); *H03M 1/1245* (2013.01)

(58) Field of Classification Search
CPC .................. H04L 25/03038; H04L 27/02647; H04B 1/525; H04B 1/1036
USPC ........................ 375/350, 316, 340, 346, 355; 455/150.1, 161.1
See application file for complete search history.

(56) References Cited

U.S. PATENT DOCUMENTS

| | | | | |
|---|---|---|---|---|
| 2005/0101277 | A1* | 5/2005 | Narayan et al. | ............ 455/232.1 |
| 2005/0151678 | A1* | 7/2005 | Bilinskis et al. | ............... 341/123 |

FOREIGN PATENT DOCUMENTS

| | | |
|---|---|---|
| DE | 2455302 | 5/1976 |
| DE | 60212795 | 6/2007 |

OTHER PUBLICATIONS

International Search Report for PCT/EP2013/056302, issued on Jan. 1, 2014.
Bilinskis, I., et al., "Digital alias-free signal processing in the GHz frequency range", Advanced Signal Processing for Microwave Applications (Digest No. 1996/226), IEE Colloquium, pp. 1-6, 1996.

* cited by examiner

*Primary Examiner* — Khai Tran
(74) *Attorney, Agent, or Firm* — Kenyon & Kenyon LLP

(57) ABSTRACT

A method is provided for suppressing interferences in a sampling process. The method includes the method step of sampling an analog useful signal at a sampling frequency f as well as determining whether an interference amplitude is present. In the presence of an interference amplitude, a stochastic shift of the chronologically equidistant sampling points in time, which are determined by the sampling frequency f, is carried out within a range $[-\Delta t; +\Delta t]$ (21) around the equidistant sampling points in time, $\Delta t$ being the maximum shift. Subsequently, a resampling of the analog useful signal is carried out. It is redetermined whether an interference amplitude is present. In the case of the continuous presence of an interference amplitude, a change in the absolute value of the maximum shift $|\Delta t|$ is carried out and the process is restarted with the method step of stochastically shifting the sampling points in time.

14 Claims, 4 Drawing Sheets

METHOD FOR SUPPRESSING INTERFERENCES IN A SAMPLING PROCESS AS WELL AS A DEVICE FOR CARRYING OUT THE METHOD

FIELD OF THE INVENTION

The present invention relates to a method for suppressing interferences in a sampling process as well as a device for carrying out the method. In particular, the present invention relates to a method for suppressing interferences in a sampling process including a subsequent analog/digital conversion with regard to a high-frequency interferer as well as a device which has an analog/digital converter and which is interference-free according to the method with regard to a high-frequency interferer.

BACKGROUND INFORMATION

In order to digitally analyze the measuring results of sensors, it is necessary to convert the analog sensor signal or the signal sampled by sensors into a digital signal. For this purpose, analog/digital converters are frequently used which use the advantages of oversampling. In this case, the narrowband input signal is sampled at a high-frequency clock and subsequently digitized with the aid of an analog/digital converter. The bandwidth of the useful signal (also referred to as a useful band or baseband) is in this case significantly smaller than half of the sampling frequency. If the input signal includes high-frequency interference signals, these interference signals are folded down into the useful band, if necessary, due to the alias effect. In order to prevent this from happening, an anti-aliasing filter is usually used which filters out the high-frequency interference signals prior to the sampling.

FIG. 1 schematically shows a frequency diagram for such a situation. Analog useful signal 16 is sampled at a sampling frequency f. In an idealized circuit or an idealized method, this takes place for example, with the aid of a periodic clock signal having the period T=1/f, a sampling value being detected in each case at a certain point in time within the period, e.g., when the periodic clock signal exceeds or falls below a certain voltage, so that the time interval between two consecutive sampling points in time corresponds to period T in each case. The sampled useful signal is then obtained in the chronological representation as a product of the input signal and a sampling function which is defined by a sequence of equidistant sampling pulses in time interval T. In the frequency representation, this product corresponds to a folding of the frequency spectrum of the input signal with the frequency spectrum of the sampling function which is defined by a sequence of equidistant spectral lines at interval T. Frequency spectrum 10 of a sampling function is illustrated in FIG. 1. The component, which is centered around 0*f, of frequency spectrum 10 of the sampling function is not shown in the present case for the sake of a clearer illustration.

In a real circuit, inevitable stochastic deviations from this idealized behavior occur. For this reason, the sampling points in time and thus the sampling pulses in the sampling function are slightly shifted compared to the idealized sampling points in time, which is reflected in the frequency spectrum of sampling function 10 in that the idealized spectral lines are blurred across the frequency ranges, which are centered around the integral multiples of the sampling frequency f, and are increasingly attenuated as the frequency increases.

The input signal may include superimposed high-frequency interference signals such as those which occur during electromagnetic coupling. According to the related art, such an interference signal is filtered out using transfer function 14 prior to the sampling with the aid of an anti-aliasing filter, e.g., a low-pass filter. Such a filtered, high-frequency interference signal 12 is shown, as an example, in FIG. 1 at a frequency which is slightly above twice the sampling frequency f. The point of intersection between transfer function 14 of the anti-aliasing filter and the frequency axis delimits baseband 1 to a range which extends from 0*f up to a frequency of f/2. The low-pass filter is in this case designed in such a way that an analog useful signal 16 may pass preferably unfiltered in baseband 1 at a typical useful frequency. The disadvantage of this approach is that an anti-aliasing filter must be implemented. In particular an implementation on an application-specific integrated circuit (ASIC) results in development complexity and space consumption.

FIG. 2 shows the frequency spectra of the sampling of an analog useful signal 16 without an anti-aliasing filter. Baseband 1 extends across a frequency range of 0*f through f/2 as in the case of filtering using an anti-aliasing filter. However, interference amplitude 20, which represents the folding of an unfiltered, high-frequency interferer 18 in the case of sampling without using the anti-aliasing filter, is folded directly into baseband 1 in most cases and therefore wrongly interpreted as a useful signal 16 during sampling at a sampling frequency f, frequency spectrum 10 of which is plotted in FIG. 2 identically to that in FIG. 1.

A method for sampling an analog input signal and for storing a digital representation of the sampling values in a memory is known from DE 602 12 795 T2, a sequence of clock pulses being generated at a predefined frequency $F_{clk}$ and being alternated with the aid of the generated pseudo random sequences. The pseudo-randomly alternated clock pulses are used for creating a sequence of sampling pulses.

The subject matter described in DE 602 12 795 T2 is based on a teaching which is described in I. Bilinskis, G. Cain, Digital Alias-Free Signal Processing in the GHz Frequency Range, XP-001133893, Institution of Electrical Engineers, 1996, p. 6/1-6/6.

Furthermore, a method for analog/digital conversion and digital signal analysis as well as a device for carrying out the method is known from DE 24 55 302 A1, the analog input signal being subjected to a sampling from equidistant and (at least pseudo) stochastically varied sampling intervals which are superposed on one another.

SUMMARY

According to the present invention, a method is provided for suppressing interferences in a sampling process. The method includes the method step of sampling an analog useful signal at a sampling frequency f as well as determining whether an interference amplitude is present. In the presence of an interference amplitude, a stochastic shift of the chronologically equidistant sampling points in time, which are determined by sampling frequency f, is carried out within a range [−Δt; +Δt] around the equidistant sampling points in time, Δt being the maximum shift. Subsequently, a resampling of the analog useful signal is carried out. It is redetermined whether an interference amplitude is present. In the case of the continuous presence of an interference amplitude, a change in the absolute value of the maximum shift |Δt| is carried out and the process is restarted with the method step of stochastically shifting the sampling points in time. In the presence of an interference amplitude, the sampling signal is thus initially acted on by a jitter of absolute value 2Δt. The stochastically shifted sampling points in time, i.e., the sampling points in time at which the analog useful signal is sampled, then vary stochastically around the chronologically equidistant sampling points in time, which are determined by sampling frequency f, within a chronological range having the limits [−Δt; +Δt]. In this case, Δt is the maximum shift by which a sampling point in time may be shifted with regard to an original sampling point in time which is defined by sampling frequency f. The analog useful signal is sampled at the stochastically shifted sampling points in time and [it] is then redetermined whether an interference amplitude is still present. If this is the case, the absolute value of the maximum shift |Δt| is reduced or increased, whereby the limits of the range [−Δt; +Δt] are also reduced or increased. The limits may, for example, be halved [+Δt/2; −Δt/2], thus corresponding to a jitter having the absolute value Δt, doubled [+2Δt; −2Δt], thus corresponding to a jitter having the absolute value 4Δt, or varied arbitrarily otherwise. Since the sampling frequency is kept constant, the baseband of the useful signal also remains unchanged.

The advantage of such a method is provided in that in the case of an analog/digital conversion which dispenses with an anti-aliasing filter, a high-frequency interferer is no longer folded into the baseband, but into a frequency range which is outside of the baseband, and the interference amplitude of the high-frequency, folded-down interferer is additionally reduced. This allows for the analogously/digitally converted useful signal to be interpreted correctly by "jittering" the sampling signal as well as by successively changing the jitter which acts on the sampling signal even without using an anti-aliasing filter. In this way, costs as well as space may be saved when implementing an analog/digital converter. Furthermore, the use of an anti-aliasing filter also results in an undesirable attenuation of the useful signal, while it is not possible to suppress all frequency portions, which still cause alias effects, with the aid of the anti-aliasing filter. These disadvantages may also be avoided by using the method according to the present invention.

In one preferred specific embodiment of the method, in the method steps of determining whether an interference amplitude is present, an interference amplitude is only present if it is greater than a threshold value. The advantage of such a specific embodiment is that the method is carried out only until the interference amplitude is smaller than an established threshold value or is initiated only if the interference amplitude exceeds a predetermined threshold value. The threshold value may in this case be selected, for example, in such a way that interference amplitudes which fall below this value have no or only a negligible effect on the correctness of the interpretation of a useful signal. This makes the method more efficient, since the effort which is carried out to suppress the interference amplitude is adapted to the benefit resulting therefrom.

In one preferred specific embodiment of the method, the method furthermore includes the step of analogously/digitally converting the sampled signal, in the method steps of determining whether an interference amplitude is present, an interference amplitude only being present if it is greater than the noise of an analog/digital conversion which is carried out within the scope of the method. In this way the noise, which is irrelevant for the interpretation of the useful signal, of an analog/digital conversion, which is applied within the scope of the method, is excluded as a trigger for a change in the sampling frequency. This makes the method more efficient, since the effort which is carried out to suppress the interference amplitude is adapted to the benefit resulting therefrom.

In one preferred specific embodiment of the method, an interference amplitude is only present if the interference amplitude is in the baseband of the frequency spectrum of a sampled useful signal. In this way, the method is initiated only if the interferer has an effect in the useful band of the frequency range, thus making the method more efficient.

In one preferred specific embodiment of the method, the sampling points in time are determined in that the phase of a clock signal assumes a threshold value. For example, the sampling points in time may be determined through zero crossings in the ascending edge of the clock signal or through zero crossings in the descending edge of the clock signal, or more generally, in that the clock signal exceeds a threshold value or in that the clock signal falls below a threshold value.

In one preferred refinement of this specific embodiment of the method, the clock signal is generated in that a periodic clock signal having period 1/f is acted on by phase noise, i.e., the phase of the clock signal is shifted stochastically as a function of time. The phase noise may, for example, be 1/f noise, i.e., a noise signal whose spectral performance density decreases inversely proportionally to the frequency. The advantage of such an implementation is that the noise and thus the jitter, which acts on the clock signal, may be influenced separately from the clock signal.

The clock signal may, however, also be generated in that a periodic clock signal having period 1/f is subjected to a frequency modulation, e.g., a frequency modulation having a sinusoidal modulation signal.

According to the present invention, any method for generating a jitter in the clock signal may be used.

In one preferred specific embodiment of the method, in the step of changing the absolute value of the maximum shift |Δt|, the ratio of the absolute value of the change in the absolute value of the stochastic shift of the chronologically equidistant sampling points in time, which are determined by sampling frequency f, to the useful frequency is greater than or equal to a value of 1.25.

The useful frequency corresponds in this case to the frequency, using which a change in the maximum shift |Δt| takes place over time within the scope of the sampling method. The useful frequency remains constant in the method according to the present invention. The ratio of the absolute value of the change in the absolute value of the stochastic shift of the chronologically equidistant sampling points in time, which are determined by sampling frequency f, to the useful frequency may also be referred to as the modulation index. One variation of the modulation index may take place only via a variation of the absolute value of the change in the absolute value of the stochastic shift of the chronologically equidistant sampling points in time, which are determined by sampling frequency f, since the useful frequency is constant when the method is carried out. If the modulation index is kept at a value ≥1.25 when the method is carried out, the method works particularly efficiently.

Initial Δt preferably corresponds to a value of [0; 2%], preferably [0; 1%], of the sampling frequency. In other words, Δt is greater than 0% and smaller than or equal to 2% of the sampling frequency, preferably greater than 0% and smaller than or equal to 1% of the sampling frequency.

In one preferred specific embodiment, the initial Δt is halved in the step of changing the range [−Δt; +Δt].

According to the present invention, a device is furthermore provided for suppressing interferences in a sampling process, including a means for sampling a useful signal at a sampling frequency and a means for determining interference amplitudes which is configured to determine whether the sampled useful signal is acted on by an interference amplitude. The means for determining interference amplitudes is furthermore configured to stochastically shift the chronologically equidistant sampling points in time, which are determined by sampling frequency f, within a range around the equidistant sampling points in time, Δt being the maximum shift. The device is subsequently configured to resample the useful signal at the stochastically shifted sampling points in time and to change the absolute value of the maximum shift |Δt| in the case of the continuous presence of an interference amplitude.

In one exemplary embodiment, the device includes a clock generator which is configured to generate a periodic clock signal and which is connected to a means for applying. The means for applying is connected to a noise source and configured to apply a noise signal generated by the noise source to the clock signal and to generate a clock signal jittered in this way. The noise source is configured to increase or reduce the mean noise output of the noise signal upon receipt of a control signal. Furthermore, the device includes a means for sampling which is connected to the means for applying and configured to sample an analog useful signal with the aid of the jittered clock signal and to supply a useful signal sampled in this way to an analog/digital converter. The analog/digital converter is configured to digitize the sampled useful signal and to supply the digitized useful signal to a means for determining interference amplitudes. In the means of determining interference amplitudes, it is determined whether the digitized useful signal is acted on by an interference amplitude. In the presence of an interference amplitude, a control signal for stochastically changing the sampling points in time is generated in the means for determining interference amplitudes and supplied to the noise source.

DETAILED DESCRIPTION

Figure 1:
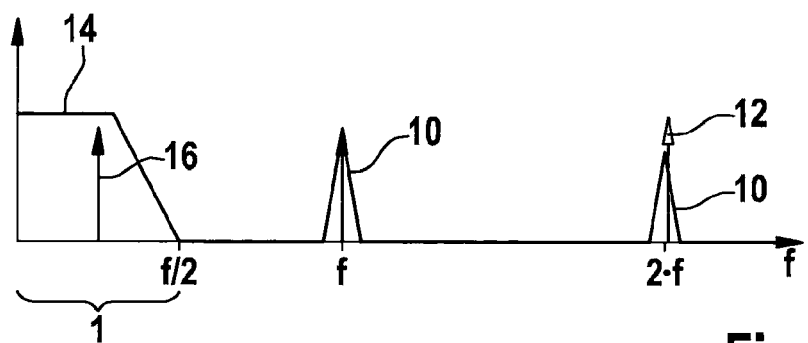
FIG. 1 shows the frequency spectra of the sampling of a useful signal using an anti-aliasing filter from the related art.
Figure 2:
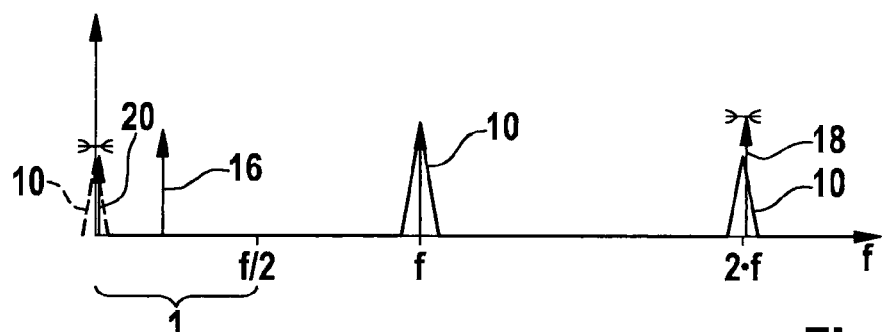
FIG. 2 shows the frequency spectra of the sampling of a useful signal without using an anti-aliasing filter from the related art.
Figure 3:
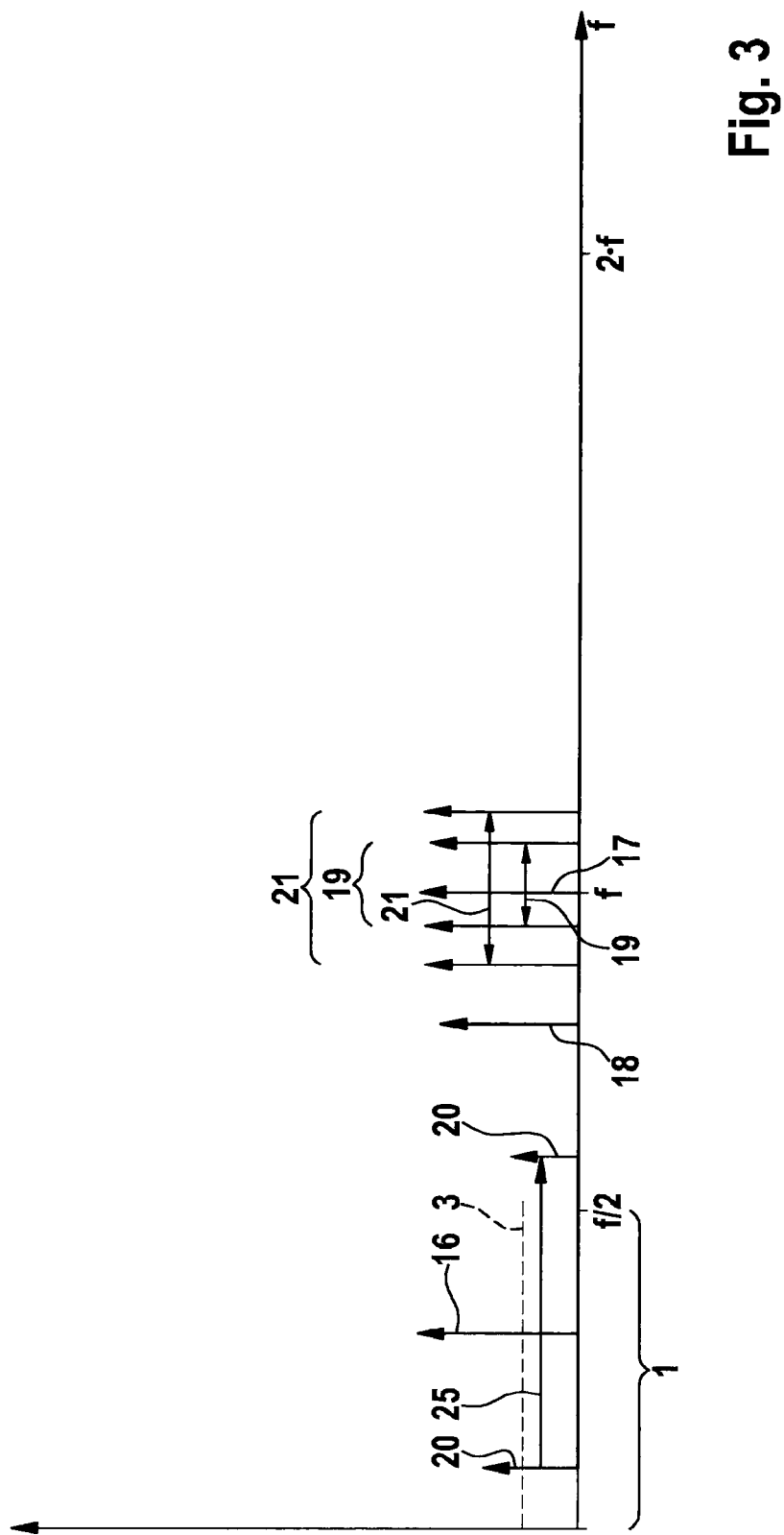
FIG. 3 shows the frequency spectra of a special sampling of a useful signal with the aid of the method according to the present invention.

FIG. 3 shows the frequency spectra of a special sampling of a useful signal using the method according to the present invention. Baseband 1 extends across the frequency range of 0f through f/2. An analog useful signal 16 is sampled at a sampling frequency 17. If interference amplitude 20 of a high-frequency, unfiltered interferer 18 is present, this interference amplitude 20 is recognized within the scope of the method according to the present invention. Subsequently, a stochastic shift of the chronologically equidistant sampling points in time, which are determined by sampling frequency f, is carried out within a range [−Δt; +Δt] 21 around the equidistant sampling points in time. The value Δt, as the maximum shift, defines in this case the limits of range [−Δt; +Δt] 21 in which the sampling points in time are located at which analog useful signal 16 is sampled after an interference amplitude 20 has been recognized. The stochastic shift of the actual sampling points in time is implemented by a jitter in this case which is applied to sampling frequency 17. For this purpose, the actual sampling points in time do not have to deviate exactly by −Δt or +Δt from the chronologically equidistant sampling points in time, which are determined by sampling frequency 17. The absolute value of the deviation rather varies from sampling to sampling, but it moves within range [−Δt; +Δt] 21. Analog useful signal 16 is sampled at the stochastically shifted sampling points in time and [it] is subsequently redetermined whether an interference amplitude 20 is present. In the case of the continuous presence of an interference amplitude 20, the absolute value of the maximum shift |Δt| is increased or reduced, thus also changing range [−Δt; +Δt] 21 to a changed range 19. In the special exemplary embodiment which is illustrated in FIG. 3, the absolute value |Δt| is reduced, as an example only, resulting in a reduction of range [−Δt; +Δt] 21 due to |Δt| being halved, as an example only. Changed range 19 may, however, also be increased with regard to original or previous range 21. Subsequently, the process is restarted with the method step of stochastically shifting the sampling points in time, but this time around changed range 19. Range [−Δt; +Δt] 21, within which a stochastic shift of the chronologically equidistant sampling points in time, which are determined by sampling frequency f, is initially carried out around the equidistant points in time according to the method, is delimited in the special exemplary embodiment illustrated here by a Δt which is greater than 0% and smaller than or equal to 2% of the sampling frequency. The range may, however, also be selected arbitrarily differently, e.g., using [−x; +y], x and y being elements from the quantity of real numbers. In the special embodiment of the method illustrated in FIG. 3, an interference amplitude 20 is only recognized if it is greater than noise 3 of an analog/digital conversion which is carried out within the scope of the method and interference amplitude 20 additionally stops in baseband 1. The threshold value starting from which an interference amplitude is recognized may, however, also be selected arbitrarily to be greater or smaller than the noise. Range [−Δt; +Δt] 21, around which the sampling frequency is jittered, is changed in the present special exemplary embodiment according to the method until it is no longer possible to determine an interference amplitude 20 in baseband 1. The utilization of the method thus results in a shift 25 of interference amplitude 20, which has been folded previously into baseband 1, of high-frequency, unfiltered interferer 18 into a frequency range which is outside of baseband 1.

Figure 4:
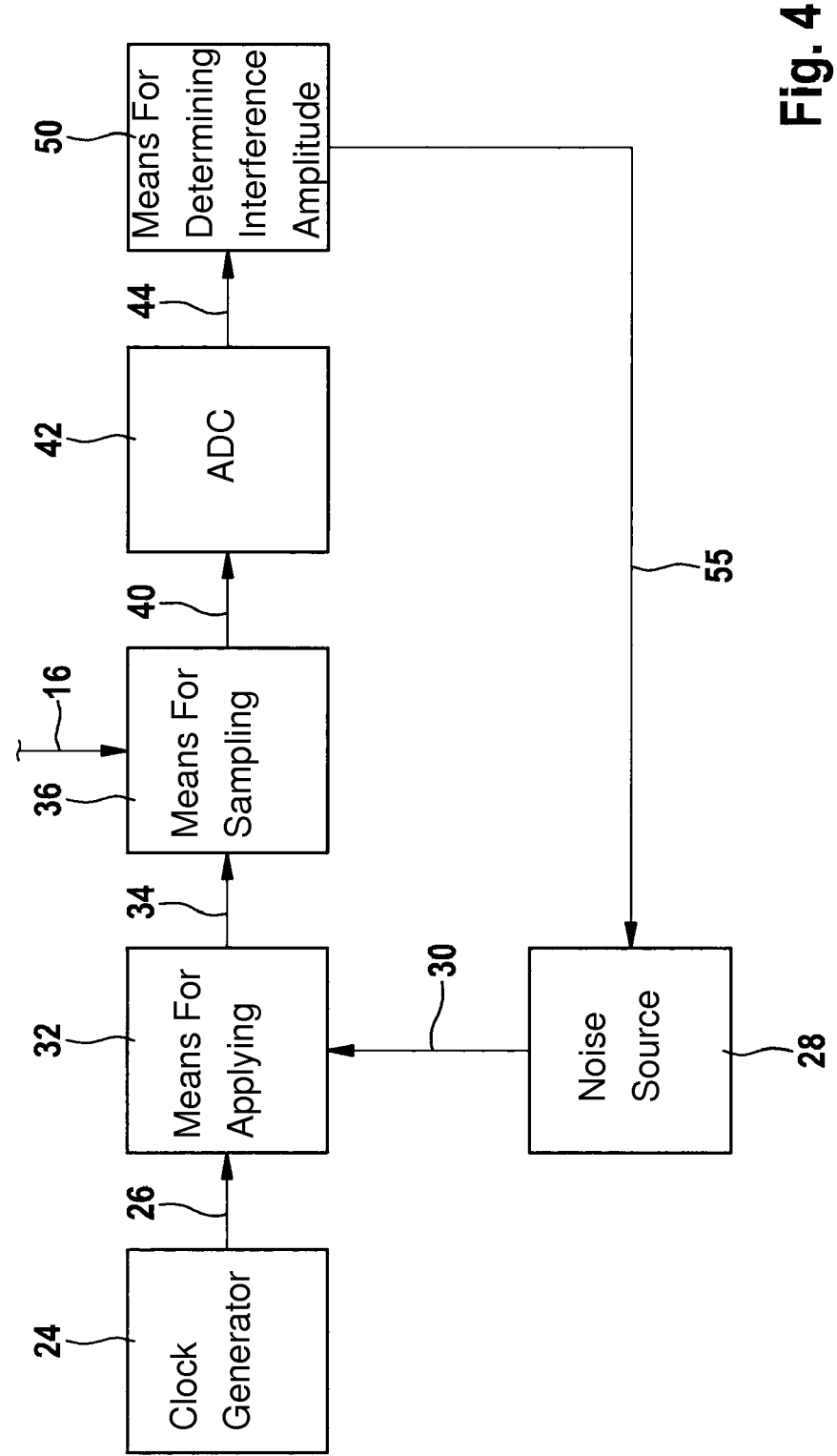
FIG. 4 shows a block diagram of one exemplary embodiment of a device according to the present invention.

FIG. 4 shows a block diagram of one exemplary embodiment of a device according to the present invention. A clock generator 24 generates a periodic clock signal 26, e.g., a sinusoidal or a rectangular clock signal. Clock generator 24 is connected to a means for applying 32 which is configured to apply a noise signal 30 to a clock signal 26 and to generate a clock signal 34 which is jittered in this way and to supply it to a means for sampling 36. Means for applying 32 is furthermore connected to a noise source 28 which is configured to generate a noise signal 30, e.g., a 1/f noise or a phase noise, and to supply it to a means for applying 32 as well as to increase or reduce the mean noise output of noise signal 30 upon receipt of a control signal 55. In means for sampling 36, an analog useful signal 16, which is also supplied to means for sampling 36, is sampled with the aid of jittered clock signal 34 in the presence of an interference amplitude 20, and useful signal 40 sampled in this way is supplied to an analog/digital converter 42. For example, means for sampling 36 samples analog useful signal 16 if jittered clock signal 34 exceeds a certain value, e.g., in the case of a zero crossing in the ascending edge. Analog/digital converter 42 is configured to digitize sampled useful signal 40 and to supply digitized useful signal 44 to a means for determining interference amplitudes 50. Here, it is determined whether digital useful signal 44 is acted on by an interference amplitude or whether an interference amplitude is present. In the presence of an interference amplitude, a control signal 55 is generated in means for determining interference amplitudes 50 and supplied to noise source 28. In noise source 28, the mean noise output is subsequently increased or reduced. The method is continued with changed noise signal 30 and, along with it, with the changed maximum shift Δt and changed range [−Δt; +Δt]. In this special exemplary embodiment, means for applying 32, means for sampling 36, analog/digital converter 42, means for determining interference amplitudes 50, as well as noise source 28 together form a contained control loop via which the change in the maximum shift Δt and the range [−Δt; +Δt] takes place. However, this exemplary embodiment represents only one possible device for carrying out the method according to the present invention. Clock signal 26 may also be jittered in a different way, e.g., without noise source 28, but by directly influencing clock generator 24.

Figure 5:
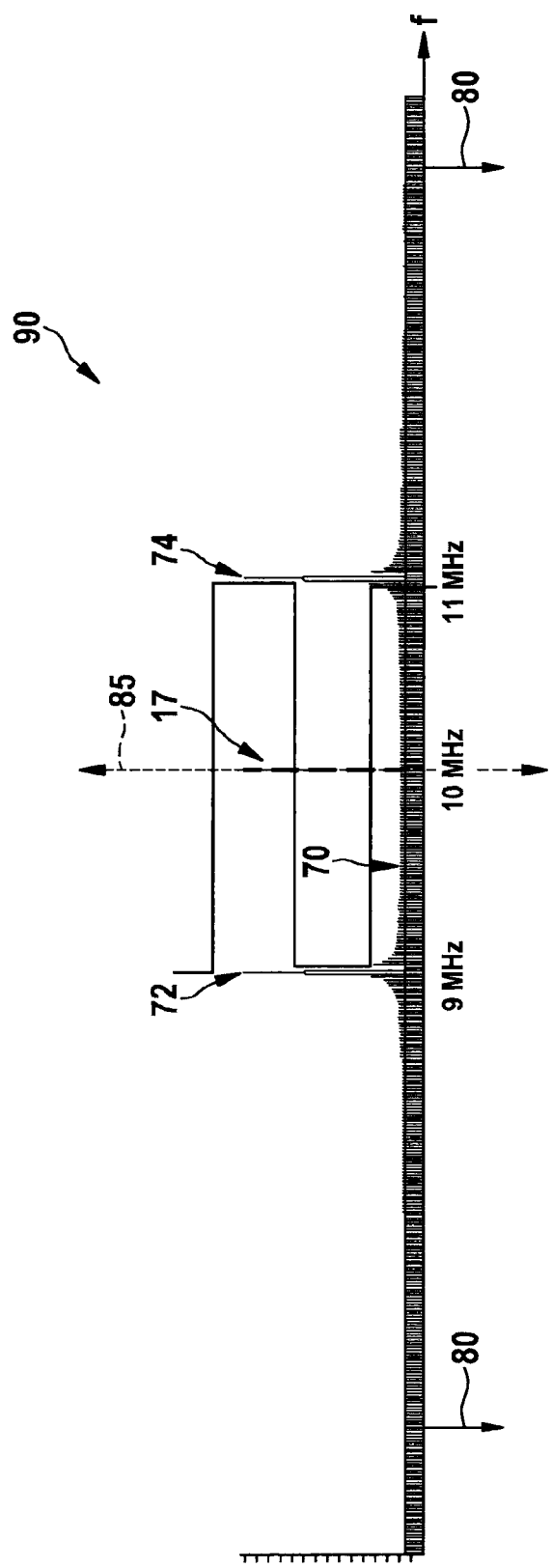
FIG. 5 shows the frequency spectrum of the sampling according to the method according to the present invention over a time interval.

In FIG. 5, a frequency spectrum of the sampling according to one preferred specific embodiment of the method according to the present invention is illustrated over a time interval which is not specified in greater detail. Here, unjittered sampling frequency 17 is plotted as a dashed line at a value of 10 MHz, as an example, for the sake of orientation without a stochastic shift of the sampling points in time. All other plotted frequency spectra result from samplings at a sampling point in time shifted by an absolute value +/−Δt which is different in each case with respect to sampling frequency 17. An arbitrarily selected sampling 70 is indicated by an arrow in FIG. 5. This sampling is at 9.5 MHz as an example only. The frequency spectrum having the maximum amplitude in FIG. 5 is provided having an arbitrarily selected useful frequency with an absolute value of approximately 9 MHz or 11 MHz in this exemplary embodiment. In this exemplary embodiment, the change in the absolute value of the stochastic shift of the chronologically equidistant sampling points in time, which are determined by sampling frequency f 17, takes place according to a certain pattern: The absolute value of the change in the absolute value of the stochastic shift from sampling to sampling is in this case constant and selected in such a way that the frequency spectra corresponding to this selection oscillate from sampling to sampling around the frequency spectrum of the unjittered sampling frequency at an approximately identical distance from this sampling frequency. In the exemplary embodiment illustrated in FIG. 5, the method according to the present invention initially samples the useful signal, for example, at a sampling point in time which is stochastically shifted by −Δt whose frequency spectrum 72 is at a value of approximately 9 MHz, i.e., approximately 1 MHz below the unjittered sampling frequency, as an example only. Subsequently, the next sampling takes place at a sampling point in time which is stochastically shifted by +Δt so that frequency spectrum 74 of this sampling is at a value of approximately 11 MHz, i.e., approximately 1 MHz above the unjittered sampling frequency. The subsequent sampling leads again to frequency spectrum 72 and restarts from there as illustrated above so that in this special exemplary embodiment, the sampling always alternates between frequency spectrum 72 at approximately 9 MHz and frequency spectrum 74 at approximately 11 MHz. This means that the modulation index remains constant. If one imagines a time axis 85 through the frequency spectrum of unjittered sampling frequency 17 and shifts diagram 90 of FIG. 5 along direction 80 and along imagined time axis 85 while carrying out the method according to the present invention, the connection of the peaks of the amplitudes of frequency spectra 72, 74 of the samplings results in a sequence of rectangles or a meandering structure. Alternatively, slight oscillations of the amplitudes may be admissible so that the edges of these rectangles are scattered or no longer parallel to the imagined time axis or the frequency axis (not illustrated in FIG. 5). In another specific embodiment, which is also not illustrated in FIG. 5, the connection of the amplitudes of the frequency spectra of the sampling results in a sinusoidal course along the imagined time axis. The frequency values, for which the frequency spectra of the sampling are in this exemplary embodiment, result, inter alia, from the interaction of sampling frequency, useful frequency, as well as the particular absolute values of the stochastic shift of the sampling points in time and are selected in FIG. 5 as examples only.

In all exemplary embodiments, a modulation index ≥1.25 may be established as a minimum value for the absolute value of the change in the absolute value of the maximum shift |Δt|. The ratio of the absolute value of the change in the absolute value of the stochastic shift of the chronologically equidistant sampling points in time, which are determined by sampling frequency f, to the useful frequency thus corresponds to a value which is greater than or equal to 1.25.

Furthermore, the change in the absolute value of the stochastic shift of the chronologically equidistant sampling points in time, which are determined by sampling frequency f, may describe a rectangular, a sinusoidal or also a scattered rectangular course, observed over time, in all exemplary embodiments, as illustrated in FIG. 5.

What is claimed is:

1. A method for suppressing an interference in a sampling process via a control device of a sampling device, comprising:
   sampling, via the sampling device, an analog useful signal at a sampling frequency f;
   determining, via the sampling device, whether an interference amplitude is present;
   in the presence of an interference amplitude, stochastically shifting chronologically equidistant sampling points in time, which are determined by the sampling frequency f, within a range [−Δt; +Δt] around the equidistant sampling points in time, Δt being a maximum shift;
   resampling, via the sampling device, the analog useful signal;
   redetermining, via the sampling device, whether an interference amplitude is present;
   in the case of a continuous presence of an interference amplitude, changing an absolute value of the maximum shift |Δt|; and
   restarting with the method step of stochastically shifting the sampling points in time.

2. The method as recited in claim 1, wherein the determining of whether an interference amplitude is present, an interference amplitude is only present if it is greater than a threshold value.

3. The method as recited in claim 1, further comprising:
   analogously/digitally converting the sampled useful signal, wherein in the method steps of determining whether an interference amplitude is present, an interference amplitude is only present if it is greater than a noise of an analog/digital conversion which is carried out within a scope of the method.

4. The method as recited in claim 1, wherein an interference amplitude is only present if the interference amplitude is in a baseband of a frequency spectrum of a sampled useful signal.

5. The method as recited in claim 1, wherein the sampling points in time are determined in that a phase of a clock signal assumes a threshold value.

6. The method as recited in claim 5, wherein the clock signal is generated in that a periodic clock signal having a period 1/f is acted on by a phase noise.

7. The method as recited in claim 6, wherein the phase noise is 1/f noise.

8. The method as recited in claim 5, wherein the clock signal is generated in that a periodic clock signal having a period 1/f is subjected to a frequency modulation.

9. The method as recited in claim 1, wherein an initial $\Delta t$ corresponds to a value of greater than 0% and smaller than or equal to 2% of the sampling frequency f.

10. The method as recited in claim 1, wherein an initial $\Delta t$ corresponds to a value of greater than 0% and smaller than or equal to 1% of the sampling frequency f.

11. The method as recited in claim 1, wherein in the step of changing the absolute value of the maximum shift $|\Delta t|$, a ratio of the absolute value of the change in the absolute value of the stochastic shift of the chronologically equidistant sampling points in time, which are determined by the sampling frequency f, to the useful frequency is greater than or equal to a value of 1.25.

12. The method as recited in claim 9, wherein the initial $\Delta t$ is halved in the step of changing the range $[-\Delta t; +\Delta t]$.

13. The method as recited in claim 10, wherein the initial $\Delta t$ is halved in the step of changing the range $[-\Delta t; +\Delta t]$.

14. A device for suppressing an interference in a sampling process, including:
hardware processing circuitry configured to execute:
an arrangement for sampling a useful signal at a sampling frequency f; and
an arrangement for determining an interference amplitude and determining whether the sampled useful signal is acted on by an interference amplitude, wherein the arrangement for determining the interference amplitude stochastically shifts, in the presence of an interference amplitude, chronologically equidistant sampling points in time, which are determined by the sampling frequency f, within a range $[-\Delta t; +\Delta t]$ around the equidistant sampling points in time, $\Delta t$ being a maximum shift, and wherein the arrangement for determining the interference amplitude resamples the useful signal at the stochastically shifted sampling points in time, and changes an absolute value of the maximum shift $|\Delta t|$ in the case of a continuous presence of an interference amplitude.

* * * * *